(12) United States Patent
Tsai et al.

(10) Patent No.: US 12,413,003 B2
(45) Date of Patent: Sep. 9, 2025

(54) ELECTRICAL CONNECTOR

(71) Applicant: LOTES CO., LTD, Keelung (TW)

(72) Inventors: Yu Lun Tsai, Keelung (TW); Zuo Feng Jin, Keelung (TW)

(73) Assignee: LOTES CO., LTD, Keelung (TW)

( * ) Notice: Subject to any disclaimer, the term of this patent is extended or adjusted under 35 U.S.C. 154(b) by 360 days.

(21) Appl. No.: 18/119,384

(22) Filed: Mar. 9, 2023

(65) Prior Publication Data

US 2023/0318217 A1 Oct. 5, 2023

(30) Foreign Application Priority Data

Apr. 2, 2022 (CN) .......................... 202210354452.4
Jun. 24, 2022 (CN) .......................... 202210728668.2

(51) Int. Cl.
*H01R 13/24* (2006.01)
*H01R 12/58* (2011.01)
*H01R 13/6471* (2011.01)

(52) U.S. Cl.
CPC ......... *H01R 13/2407* (2013.01); *H01R 12/58* (2013.01); *H01R 13/6471* (2013.01)

(58) Field of Classification Search
CPC ............................ H01R 13/2407; H01R 12/58; H01R 13/6471; H01R 12/714; H01R 12/73; H01R 12/7076; H01R 13/2435; H01R 12/7082; H01R 13/6461; H01R 13/24; H05K 7/1069
See application file for complete search history.

(56) References Cited

U.S. PATENT DOCUMENTS

| 6,729,890 | B2 * | 5/2004 | Shin ...................... H01R 13/26 439/74 |
| 6,793,504 | B2 | 9/2004 | Noda et al. |
| 8,439,709 | B2 * | 5/2013 | Fan ...................... H01R 12/716 439/660 |
| 8,708,716 | B1 * | 4/2014 | Ho ...................... H01R 12/714 439/83 |
| 9,172,161 | B2 * | 10/2015 | Walden .............. H01R 13/2435 |
| 9,350,091 | B2 * | 5/2016 | Huang .................. H01R 12/57 |
| 9,882,296 | B1 * | 1/2018 | Ju ...................... H01R 13/2435 |

(Continued)

FOREIGN PATENT DOCUMENTS

CN 104518317 A 4/2015

*Primary Examiner* — Truc T Nguyen
(74) *Attorney, Agent, or Firm* — Troutman Pepper Locke LLP; Tim Tingkang Xia, Esq.

(57) ABSTRACT

An electrical connector includes a plurality of terminal groups arranged along a front-rear direction. Each terminal group is formed by a first terminal and a second terminal provided in the front-rear direction. The first terminal includes a first base portion and two first elastic arms connected to the first base portion. Each first elastic arm has a first contact portion located in front of the first base portion. The second terminal includes a second base portion and two second elastic arms connected to the second base portion. The second elastic arms are formed by extending backward and then bending and extending forward relative to the second base portion. Each second elastic arm has a second contact portion. In a same terminal group, along the front-rear direction, a distance between the first and second base portions is less than a distance between the first and second contact portions.

20 Claims, 10 Drawing Sheets (56) References Cited

U.S. PATENT DOCUMENTS

| | | | | |
|---|---|---|---|---|
| 10,199,756 B2* | 2/2019 | Ju | ...................... | H01R 13/2464 |
| 10,547,130 B2* | 1/2020 | Ju | .......................... | H01R 13/46 |
| 10,797,424 B2* | 10/2020 | Hsu | .................... | H01R 12/7076 |
| 10,998,662 B2* | 5/2021 | Chen | .................... | H01R 12/714 |
| 11,251,557 B2* | 2/2022 | Dai | ...................... | H01R 43/16 |
| 11,309,646 B2* | 4/2022 | Ou | ..................... | H01R 12/7082 |
| 11,817,644 B2* | 11/2023 | Tsai | .................... | H01R 13/405 |
| 2010/0291774 A1* | 11/2010 | Cheng | ................. | H05K 7/1069 |
| | | | | 439/66 |
| 2013/0267118 A1* | 10/2013 | Cai | ................... | H01R 13/6581 |
| | | | | 439/607.01 |
| 2021/0151916 A1 | 5/2021 | Li et al. | | |
| 2021/0210885 A1* | 7/2021 | Dai | .................... | H01R 13/2435 |
| 2021/0305754 A1* | 9/2021 | Ho | ..................... | H01R 12/7082 |
| 2023/0018797 A1* | 1/2023 | Jin | ...................... | H01R 13/516 |
| 2023/0075216 A1* | 3/2023 | Jin | ..................... | H01R 13/6315 |
| 2024/0047904 A1* | 2/2024 | Huang | ................ | H01R 12/712 |

* cited by examiner

ELECTRICAL CONNECTOR

CROSS-REFERENCE TO RELATED PATENT APPLICATION

This non-provisional application claims priority to and the benefit of, pursuant to 35 U.S.C. § 119(a), patent application Serial No. CN202210354452.4 filed in China on Apr. 2, 2022, and patent application Serial No. CN202210728668.2 filed in China on Jun. 24, 2022. The disclosure of each of the above applications is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to an electrical connector, and particularly to an electrical connector having elastic conductive terminals of two different structures.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

In the field of the existing electrical connector, particularly the electrical connector for transmitting high frequency signals, the requirement for the signal integrity becomes higher. In the electrical connector, to ensure the signal integrity, particular to resolve the crosstalk issue during the signal transmission, it is required to focus on the design of the specific structure of the conductive terminals.

Figure 10:
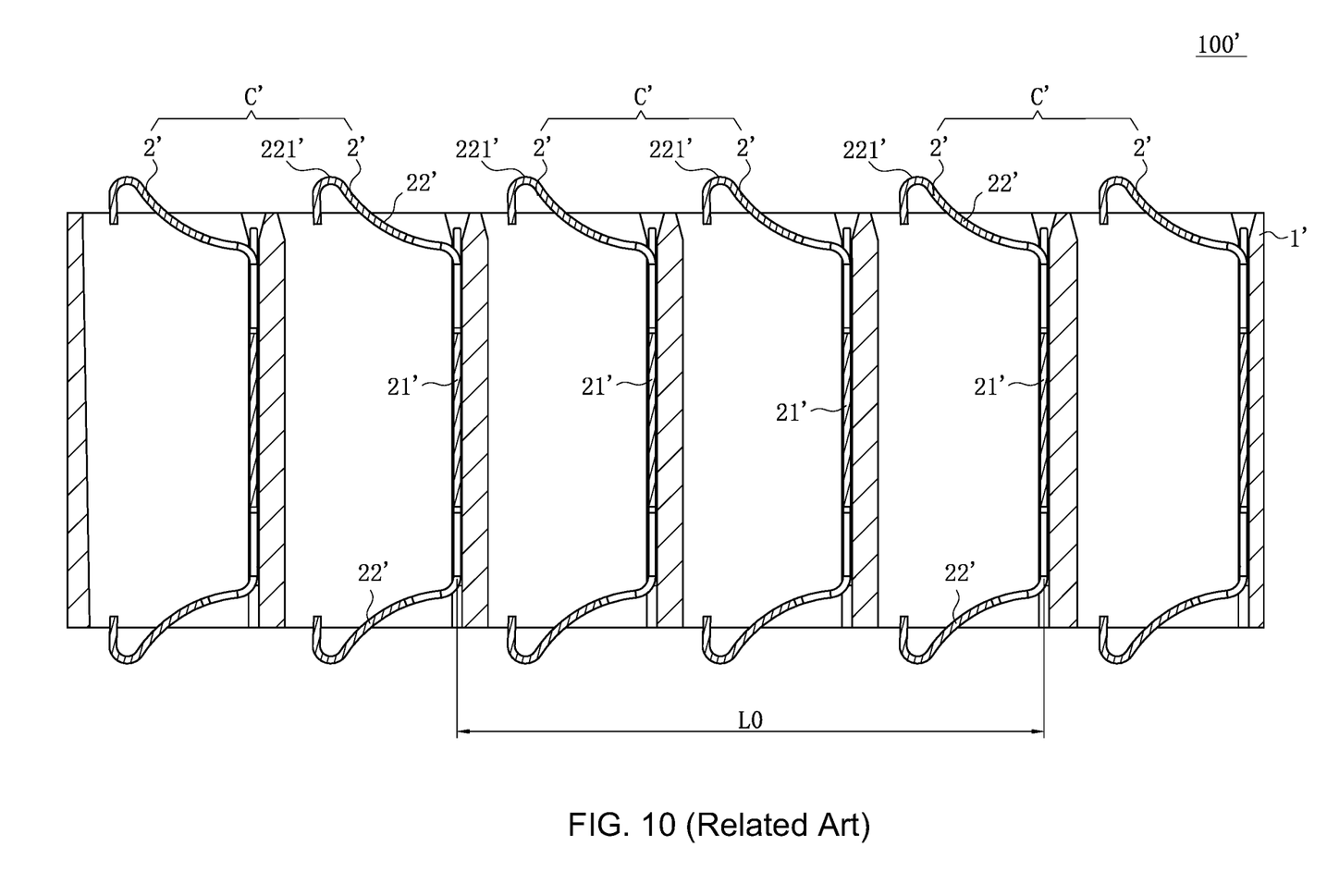
FIG. 10 is a schematic view of related art.

As shown in FIG. 10, an electrical connector 100' generally used for supporting a central processing unit (CPU) has only conductive terminals 2' having a single structure. These conductive terminals 2' face an identical direction in a local region, and two conductive terminals 2' adjacent to each other in a front-rear direction form a terminal group C'. Each conductive terminal 2' includes a base portion 21' and an elastic arm 22 bending and extending from the base portion 21'. The elastic arm 22' is provided with a contact portion 221' to be in contact with the CPU. The base portion 21' occupies a larger proportion relative to the whole conductive terminal 2', and the base portions 21' and the contact portions 221' are arranged at equal distances. When the signals being transmitted have a higher frequency, the conductive terminals 2' being densely arranged, particularly at the base portions 21' thereof, have a serious crosstalk issue.

Therefore, a heretofore unaddressed need to design an electrical connector exists in the art to address the aforementioned deficiencies and inadequacies.

SUMMARY

In view of the deficiencies in the background art, the present invention is directed to an electrical connector, which has conductive terminals of two different structures, thus adjusting the distance between the structures of the different conductive terminals having a larger proportion thereof, and reducing the crosstalk between the signal terminals during the signal transmission.

To achieve the foregoing objective, the present invention adopts the following technical solutions.

An electrical connector includes a body and a plurality of conductive terminals accommodated in the body. The conductive terminals comprise a plurality of terminal groups arranged along a front-rear direction, and each of the terminal groups is formed by a first terminal and a second terminal adjacent to each other in the front-rear direction. The first terminal comprises a first base portion and two first elastic arms connected to an upper end and a lower end of the first base portion, the first base portion and the two first elastic arms altogether form a first opening facing forward, each of the two first elastic arms has a first contact portion, and the first contact portion is located in front of the first base portion. The second terminal comprises a second base portion and two second elastic arms connected to an upper end and a lower end of the second base portion, the second elastic arms are formed by extending backward and then bending and extending forward relative to the second base portion, and each of the two second elastic arms has a second contact portion. In a same terminal group of the terminal groups, the first base portion and the second base portion are provided face-to-face in the front-rear direction, and in the front-rear direction, a distance between the first base portion and the second base portion is less than a distance between the first contact portion and the second contact portion.

In certain embodiments, in the front-rear direction, the distance between the first contact portion and the second contact portion in the same terminal group is equal to a distance between the first contact portion and the second contact portion in two adjacent ones of the terminal groups.

In certain embodiments, the first base portion and the second base portion respectively extend vertically, and the second contact portion is located behind the second base portion.

In certain embodiments, the first elastic arm connected to the upper end of the first base portion is defined as a first upper elastic arm, the first elastic arm connected to the lower end of the first base portion is defined as a first lower elastic arm, the second elastic arm connected to the upper end of the second base portion is defined as a second upper elastic arm, the second elastic arm connected to the lower end of the second base portion is defined as a second lower elastic arm, a location of the second upper elastic arm connected to the second base portion is lower than a location of the first upper elastic arm connected to the first base portion, and a location of the second lower elastic arm connected to the second base portion is higher than a location of the first lower elastic arm connected to the first base portion.

In certain embodiments, each of the second elastic arms has a first extending arm, a second extending arm and a bending portion connecting the first extending arm and the second extending arm, the first extending arm is formed by bending and extending backward from the second base portion, the second extending arm is formed by extending forward from the bending portion, and the bending portion and a location of each of the first elastic arms connected to the first base portion are provided to be of equal height.

In certain embodiments, the first terminals and the second terminals of the terminal groups are arranged alternately along the front-rear direction, and in the same terminal group, one of the first terminal and the second terminal functions as a single-ended signal terminal, and the other of the first terminal and the second terminal functions as a ground terminal.

In certain embodiments, in three adjacent ones of the terminal groups in the front-rear direction, a front terminal group thereof and a rear terminal group thereof include signal terminals configured to transmit differential signals, and a middle terminal group thereof includes ground terminals.

In certain embodiments, the conductive terminals further comprise at least one third terminal, the third terminal and the terminal groups are arranged along the front-rear direction, one of the at least one third terminal is arranged between two adjacent ones of the terminal groups, each of the terminal groups is configured to transmit differential signals, and the third terminal is a ground terminal.

In certain embodiments, a structure of the third terminal is identical to a structure of one of the first terminal and the second terminal adjacent thereto in the front-rear direction.

In certain embodiments, the third terminal comprises a third base portion and two third elastic arms connected to an upper end and a lower end of the third base portion, the third base portion and the two third elastic arms altogether form a third opening facing forward, each of the two third elastic arms has a third contact portion, the third contact portion is located in front of the third base portion, and in the front-rear direction, a distance between the second base portion and the first base portion adjacent thereto at one side of the second base portion is less than a distance between the second base portion and the third base portion adjacent thereto at the other side of the second base portion.

In certain embodiments, the third terminal comprises a third base portion and two third elastic arms connected to an upper end and a lower end of the third base portion, each of the two third elastic arms has a third contact portion, and in the front-rear direction, a distance between the third contact portion and the first contact portion or the second contact portion adjacent thereto is equal to the distance between the first contact portion and the second contact portion in each of the terminal groups.

In certain embodiments, each of the terminal groups comprises an add-on member conductively connected to the second terminal, the add-on member has a fourth base portion, the fourth base portion and the second base portion are provided face-to-face in the front-rear direction, and the fourth base portion and the first base portion are located at two opposite sides of the second base portion.

In certain embodiments, the fourth base portion extends upward and downward to the two second elastic arms, and when the two second elastic arms are pressed, the fourth base portion abuts the two second elastic arms to form electrical connections therebetween.

In certain embodiments, each of the second elastic arms has a first extending arm, a second extending arm and a bending portion connecting the first extending arm and the second extending arm, the first extending arm is formed by bending and extending backward from the second base portion, the second extending arm is formed by extending forward from the bending portion, and when the two second elastic arms are pressed, the fourth base portion abuts the two bending portions of the two second elastic arms.

In certain embodiments, the add-on member has a connecting portion, the connecting portion is integrally connected to the fourth base portion, and the connecting portion is fixedly connected to or abuts the second base portion.

In certain embodiments, in the same terminal group, a distance between the fourth base portion and the second base portion in the front-rear direction is greater than the distance between the first base portion and the second base portion in the front-rear direction.

An electrical connector includes a body and a plurality of conductive terminals accommodated in the body. The conductive terminals comprise a plurality of terminal groups arranged along a front-rear direction, and each of the terminal groups is formed by a first terminal and a second terminal adjacent to each other in the front-rear direction. The first terminal comprises a first base portion and a first elastic arm connected to an upper end of the first base portion, the first base portion is in a flat plate shape, the first elastic arm is formed by bending forward from the first base portion or by bending backward and then forward from the first base portion, the first elastic arm has a first contact portion, and the first contact portion is located in front of the first base portion. The second terminal comprises a second base portion and a second elastic arm connected to an upper end of the second base portion, the second base portion is in a flat plate shape, the second elastic arm is formed by extending backward and then bending and extending forward relative to the second base portion, and the second elastic arm has a second contact portion. In a same terminal group of the terminal groups, the first base portion and the second base portion are provided face-to-face in the front-rear direction, and in the front-rear direction, a distance between the first base portion and the second base portion is less than a distance between the first contact portion and the second contact portion.

In certain embodiments, the first terminal and the second terminal in each of the terminal groups are both ground terminals or are both signal terminals, the terminal groups being arranged in the front-rear direction are arranged in a ground-signal alternate manner, and the terminal groups including both the signal terminals are configured to transmit differential signals.

In certain embodiments, each of the terminal groups comprises an add-on member, the add-on member has a fourth base portion extending vertically, and the fourth base portion and one of the first base portion and the second base portion are provided face-to-face in the front-rear direction.

In certain embodiments, the fourth base portion and the first base portion are located at two opposite sides of the second base portion, the add-on member has a connecting portion, the connecting portion is integrally connected to the fourth base portion, the connecting portion and the second base portion are fixed by soldering, and the add-on member and the second terminal are altogether assembled to the body.

Compared with the related art, in order to adjust the distance between the respective portions of the first terminal and the second terminal occupying a larger proportion thereof, on the premise of maintaining a consistent final extending direction of the first elastic arm and the second elastic arm in the same terminal group without increasing the distance between the first contact portion and the second contact portion adjacent to each other, the second base portion is closer to the first base portion, such that the second elastic arm extend backward and then forward. When one of the first terminal and the second terminal of each terminal group functions as a single-ended signal terminal, and the other thereof functions as the ground terminal, since the first base portion and the second base portion are located closer relative to the first contact portion and the second contact portion, and the first base portion and the second base portion generally occupy a larger proportion in the whole conductive terminal, it is easier for the ground terminal to absorb the electromagnetic radiation emitted by the signal terminal, thus reducing the crosstalk, and enhancing the shielding effect between the signal terminals inside the electrical connector. When the terminal group is used to transmit differential signals, that is, it functions as a differential signal pair, the distance between the structures of the adjacent differential signal pairs having a larger proportions thereof is increased, thus reducing the mutual capacitance and mutual inductance between the differential signal pairs, and further reducing the crosstalk between the adjacent differential signal pairs.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-10. In accordance with the purposes of this invention, as embodied and broadly described herein, this invention, in one aspect, relates to an electrical connector.

Figure 1:
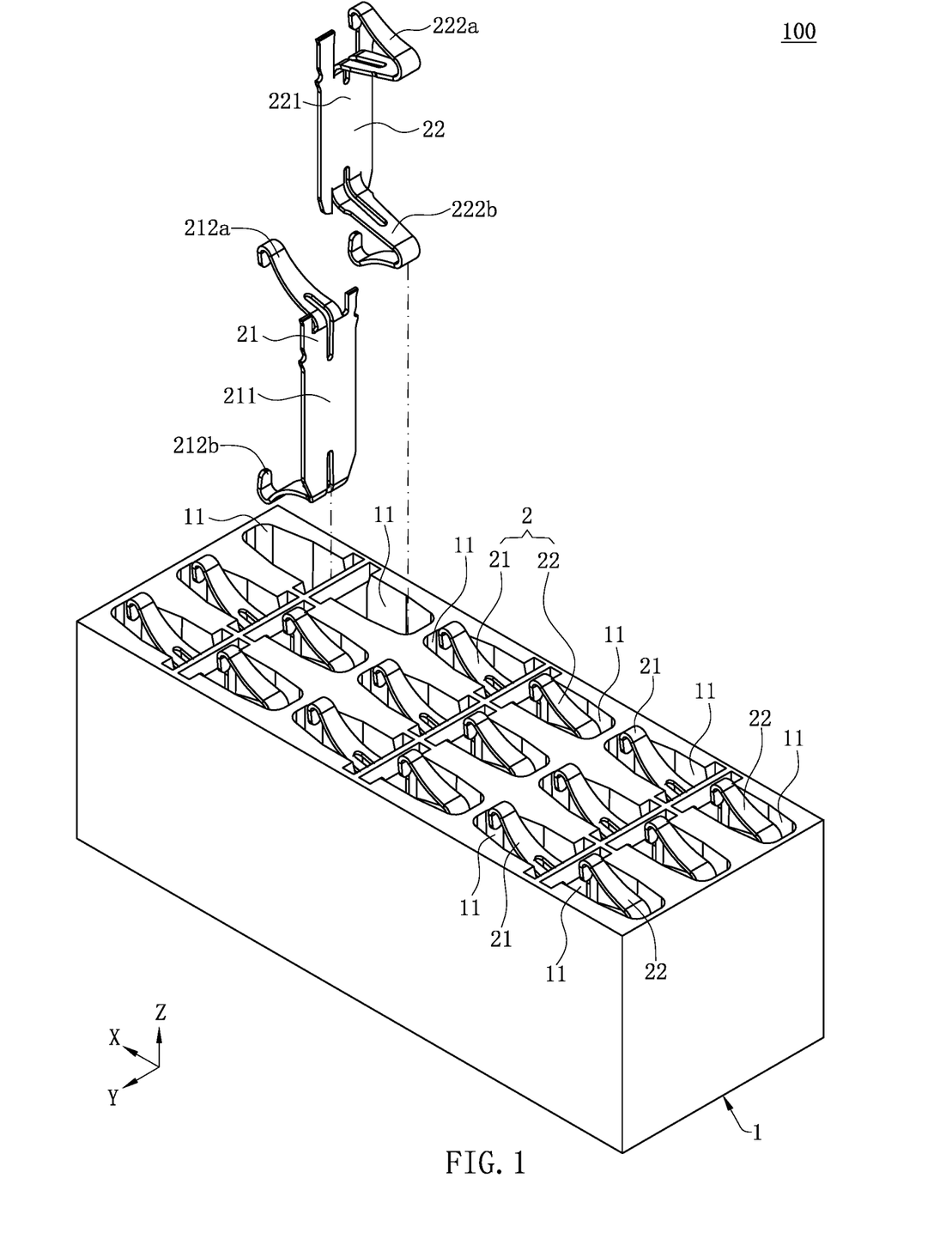
FIG. 1 is a partial disassembled view of an electrical connector according to a first embodiment of the present invention.

FIG. 1 is a schematic view of an electrical connector 100 according to a first embodiment of the present invention. The electrical connector 100 has a body 1 and a plurality of conductive terminals 2, and is used to connect two electronic components (not shown), and the two electronic components are in contact with the conductive terminals 2 through a plurality of contact points (not shown). For example, one of the electronic components may be a chip, and the other thereof may be a circuit board. For convenience of description purposes, the X direction in the accompanying drawings functions as the "forward" direction in the description, the Y direction in the accompanying drawings functions as the "left" direction in the description, and the Z direction in the accompanying drawings functions as the "upward" direction in the description, but the actual application of the present invention is not limited thereto.

Figure 2:
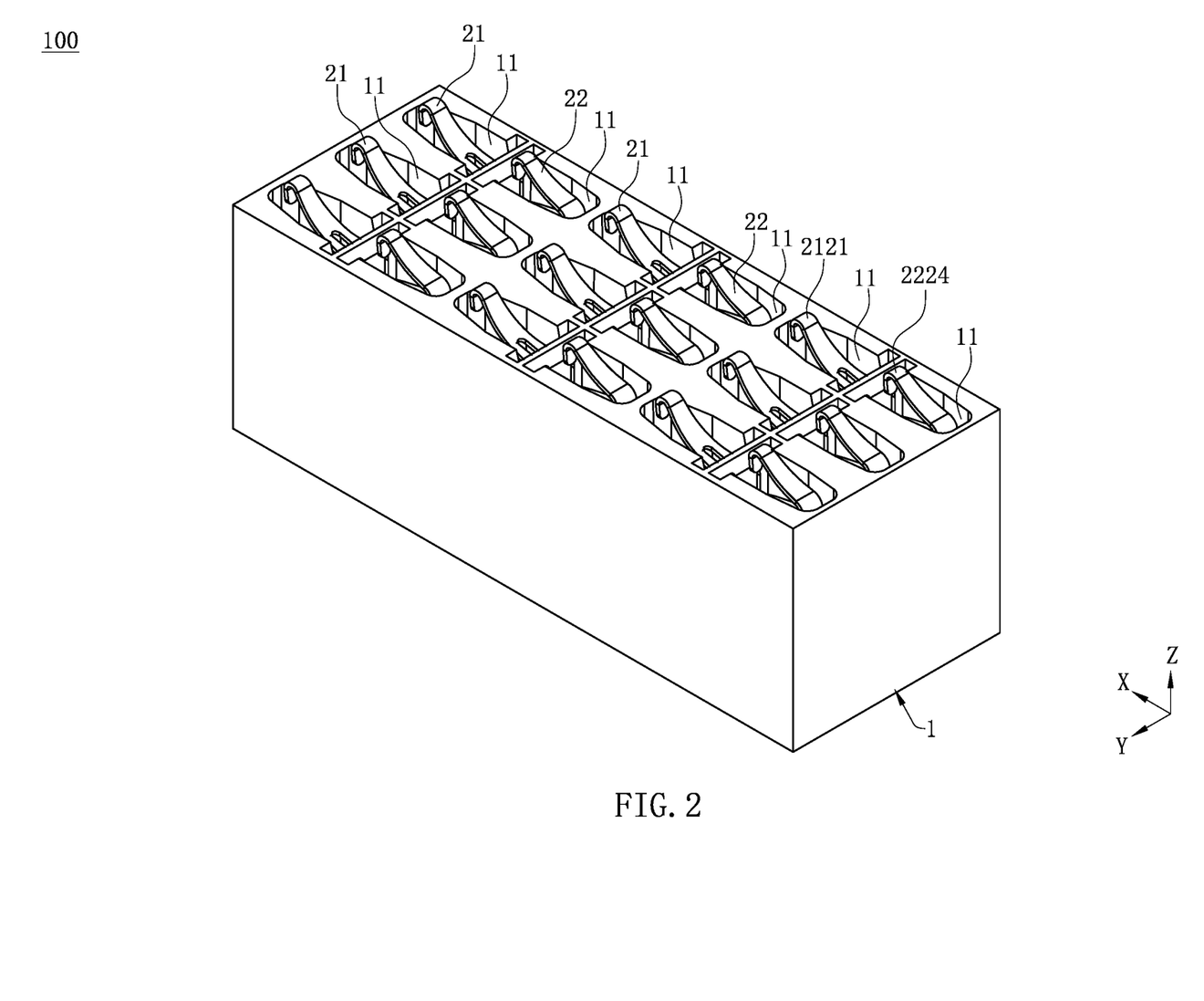
FIG. 2 is an assembled view of FIG. 1.
Figure 3:
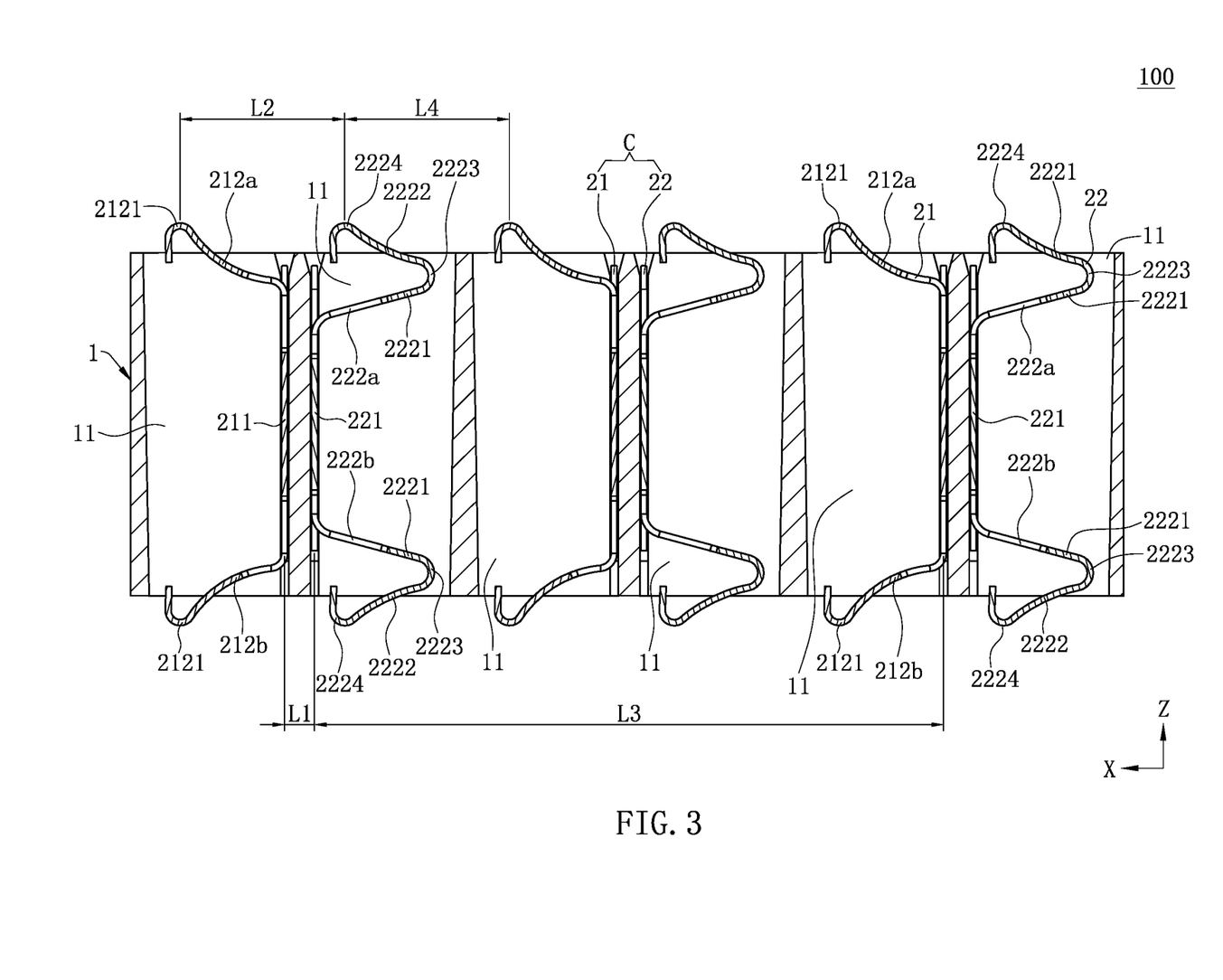
FIG. 3 is a sectional view of FIG. 2.

As shown in FIG. 1 to FIG. 3, the body 1 is formed by an insulating material, and has a plurality of accommodating holes 11. The accommodating holes 11 run vertically through an upper surface and a lower surface of the body 1, and are used to accommodate the conductive terminals 2.

As shown in FIG. 1 to FIG. 3, the conductive terminals 2 are provided in a plurality of rows in the left-right direction. The conductive terminals 2 in each row include a plurality of terminal groups C arranged along the front-rear direction. Each terminal group C is formed by a first terminal 21 and a second terminal 22 adjacent to each other in the front-rear direction, and the structures of the first terminal 21 and the second terminal 22 are different. In the present embodiment, the first terminal 21 and the second terminal 22 are formed by punching a metal plate.

Figure 4:
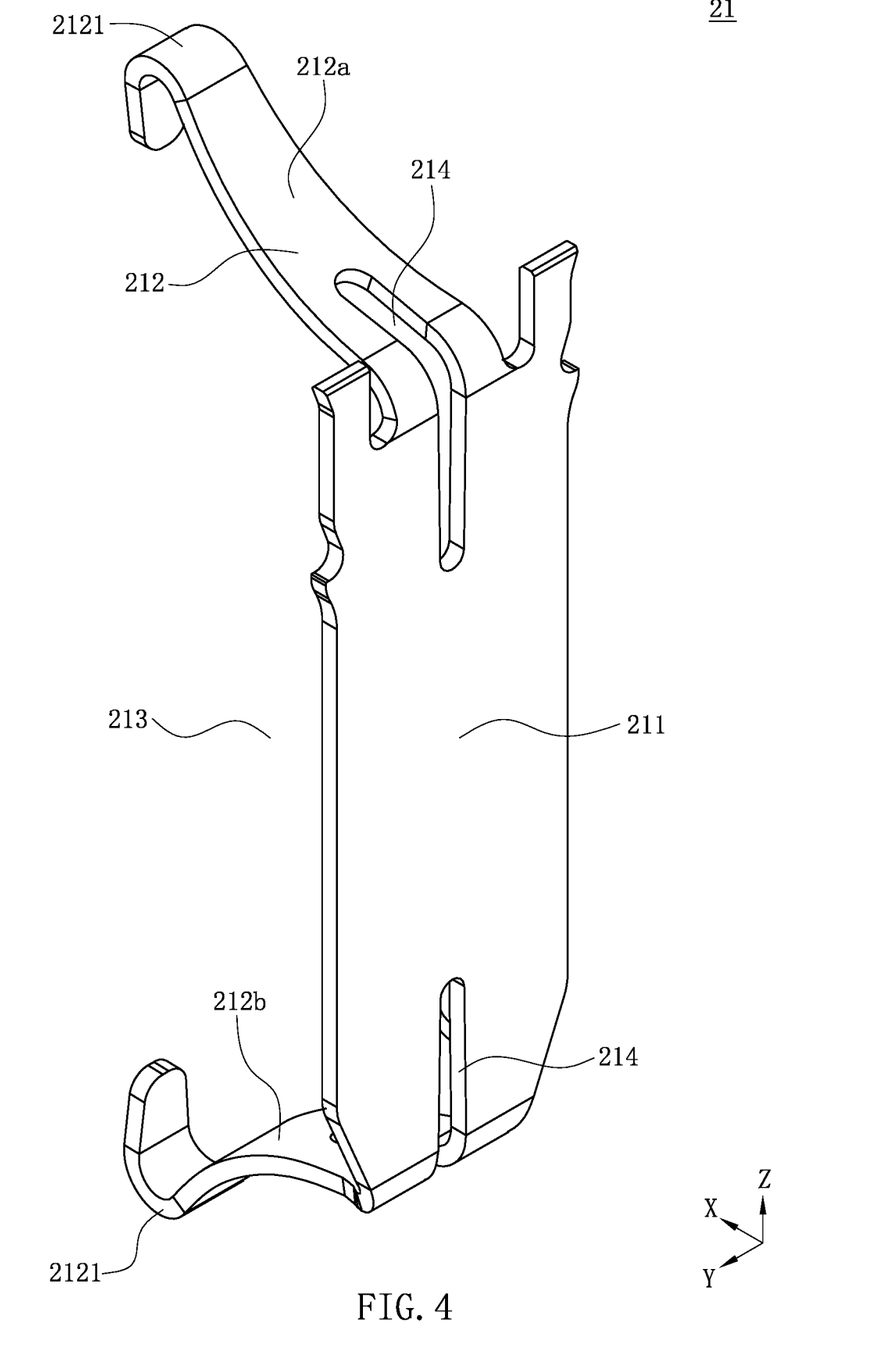
FIG. 4 is a perspective view of a first terminal in FIG. 1.

As shown in FIG. 4, the first terminal 21 includes a first base portion 211 extending vertically and two first elastic arms 212 connected to an upper end and a lower end of the first base portion 211, where the first elastic arm 212 connected to the upper end of the first base portion 211 is defined as a first upper elastic arm 212a, and the first elastic arm 212 connected to the lower end of the first base portion 211 is defined as a first lower elastic arm 212b. Each first elastic arm 212 has a first contact portion 2121 used to be in contact with some of the contact points (not shown). The first elastic arms 212 extend forward relative to the first base portion 211, and the first base portion 211 and the two first elastic arms 212 altogether form a first opening 213 facing forward. The first contact portion 2121 is located in front of the first base portion 211. In the present embodiment, the first base portion 211 is in a flat plate shape. In other embodiments, the first elastic arms 212 may be formed by bending backward and then bending and extending forward, and the first terminal 21 may be provided with only one first elastic arm 212, which is connected to the upper end of the first base portion 211. The lower end of the first base portion 211 is connected to a first soldering portion (not shown), which is used to be soldered to the circuit board (not shown).

As shown in FIG. 4, the first terminal 21 is further provided with a first through slot 214 at a location of the first base portion 211 connected to each first elastic arm 212. The first through slot 214 runs through the first terminal 21, and the first through slot 214 extends on the first base portion 211 and each first elastic arm 212. The two first through slots 214 are not in communication with each other. In other embodiments, the two first through slots 214 may be in communication with each other.

Figure 5:
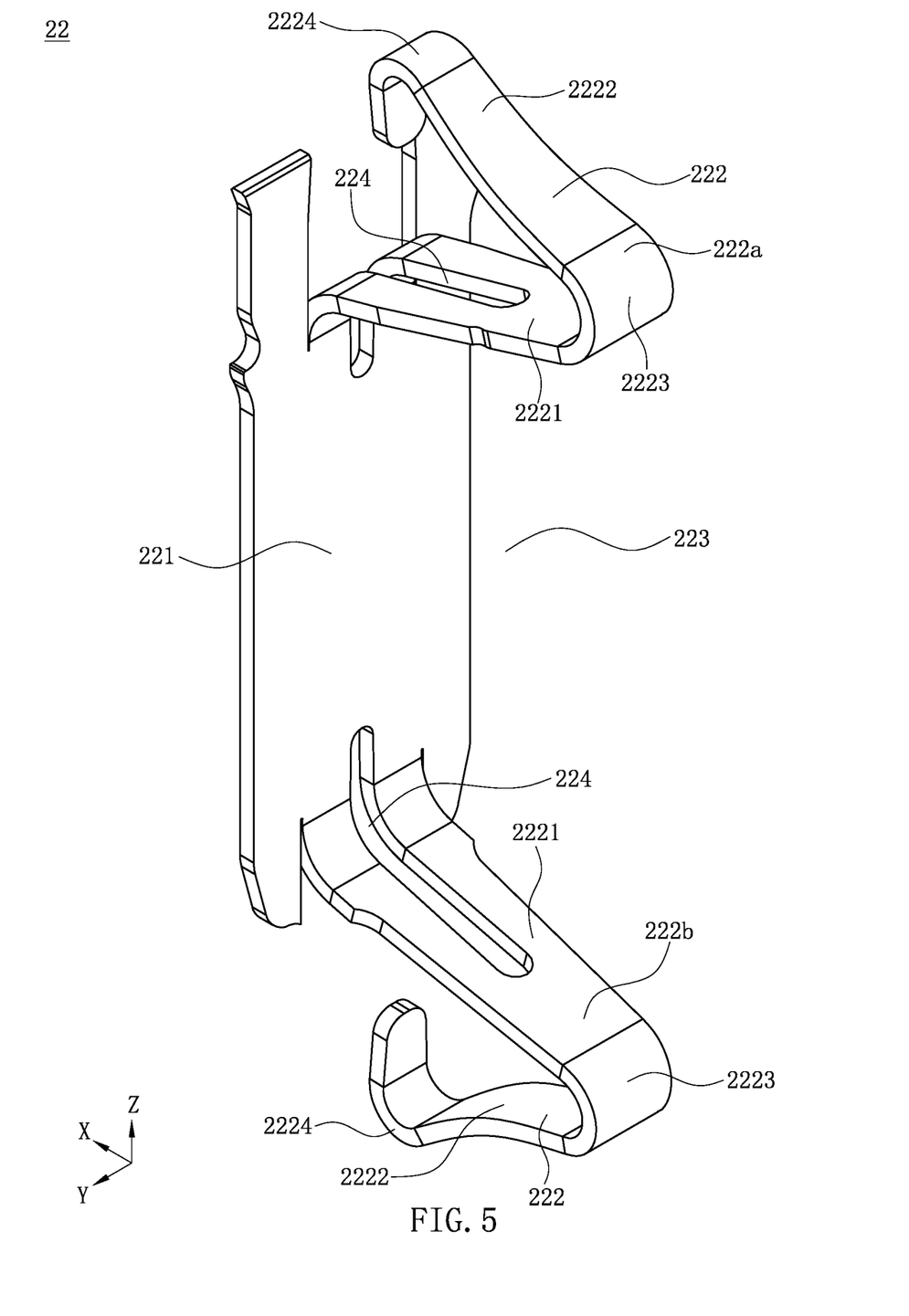
FIG. 5 is a perspective view of a second terminal in FIG. 1.

As shown in FIG. 5, the second terminal 22 includes a second base portion 221 extending vertically and two second elastic arms 222 connected to an upper end and a lower end of the second base portion 221, where the second elastic arm 222 connected to the upper end of the second base portion 221 is defined as a second upper elastic arm 222a, and the second elastic arm 222 connected to the lower end of the second base portion 221 is defined as a second lower elastic arm 222b. Each second elastic arm 222 has a first extending arm 2221, a second extending arm 2222 and a bending portion 2223 connecting the first extending arm 2221 and the second extending arm 2222. The first extending arm 2221 is formed by bending and extending backward from the second base portion 221, and the second extending arm 2222 is formed by extending forward from the bending portion 2223. That is, the second extending arm 2222 is formed by bending and extending backward relative to the second base portion 221, and then bending and extending forward. The second base portion 221 and the two first extending arms 2221 altogether form a second opening 223 facing backward. Each second extending arm 2222 has a second contact portion 2224, and the second contact portion 2224 is used to be in contact with some other contact points (not shown). In the present embodiment, the second base portion 221 is in a flat plate shape, and the second contact portion 2224 does not pass forward beyond the second base portion 221 in the front-rear direction. That is, the second contact portion 2224 is located behind the second base portion 221. In other embodiments, the second contact portion 2224 may be provided to pass forward beyond the second base portion 221 in the front-rear direction. In yet another embodiment, the second terminal 22 may be provided with only one second elastic arm 222, which is connected to the upper end of the second base portion 221. The lower end of the second base portion 221 is connected to a second soldering portion (not shown), which is used to be soldered to the circuit board (not shown).

As shown in FIG. 5, the second terminal 22 is further provided with a second through slot 224 at a location of the second base portion 221 connected to each second elastic arm 222. The second through slot 224 runs through the second terminal 22, and the second through slot 224 extends on the second base portion 221 and each second elastic arm 222. The two second through slots 224 are not in communication with each other. In other embodiments, the two second through slots 224 may be in communication with each other.

As shown in FIG. 3, in a same terminal group C, the first base portion 211 and the second base portion 221 are provided face-to-face in the front-rear direction, and in the front-rear direction, a distance L1 between the first base portion 211 and the second base portion 221 is less than a distance L2 between the first contact portion 2121 and the second contact portion 2224.

As shown in FIG. 3, in the conductive terminals 2 in a same row, the first terminals 21 and the second terminals 22 of the terminal groups C are arranged alternately along the front-rear direction, and in the front-rear direction, a distance L1 between the second base portion 221 and the first base portion 211 adjacent at a front side thereof is less than a distance L3 between the second base portion 221 and the first base portion 211 adjacent at a rear side thereof. In the same terminal group C, the distance L2 between the first contact portion 2121 and the second contact portion 2224 is equal to a distance L4 between the first contact portion 2121 and the second contact portion 2224 in two adjacent terminal groups C, such that without changing the arrangement of the contact points of the chip and the arrangement of the contact points of the circuit board, adjustment is correspondingly made merely to the location of the second base portion 221 of the second terminal 22, thus satisfying the high frequency requirement of the electrical connector 100.

As shown in FIG. 3, a location of the second upper elastic arm 222a connected to the second base portion 221 is lower than a location of the first upper elastic arm 212a connected to the first base portion 211, and a location of the second lower elastic arm 222b connected to the second base portion 221 is higher than a location of the first lower elastic arm 212b connected to the first base portion 211. The bending portion 2223 and a location of each first elastic arm 212 connected to the first base portion 211 are provided to be of equal height, and the second contact portion 2224 and the first contact portion 2121 are provided to be of equal height.

As shown in FIG. 2 and FIG. 3, the terminal groups C may function as differential signal terminals or ground terminals. Alternatively, in each terminal group C, one of the first terminal 21 and the second terminal 22 functions as a single-ended signal terminal, and the other thereof functions as a ground terminal.

As shown in FIG. 3, when one terminal of each terminal group C functions to transmit single-ended signals, and the other thereof functions as a ground terminal, for example, the first terminal 21 functions as the signal terminal and the second terminal 22 functions as the ground terminal, or the first terminal 21 functions as the ground terminal and the second terminal 22 functions as the signal terminal, since the first base portion 211 and the second base portion 221 in the same terminal group C are located closer relative to the first contact portion 2121 and the second contact portion 2224, and the first base portion 211 and the second base portion 221 generally occupy a larger proportion in the whole conductive terminal 2, it is easier for the ground terminal to absorb the electromagnetic radiation emitted by the signal terminal, thus reducing the crosstalk, and enhancing the shielding effect between the signal terminals inside the electrical connector 100.

As shown in FIG. 3, when some of the terminal groups C in the same row are used to transmit differential signals, that is, they function as differential signal pairs, and the other terminal groups C are used for grounding, for example, in three adjacent terminal groups C in the front-rear direction, the first terminal 21 and the second terminal 22 in each of a front terminal group C and a rear terminal group C are signal terminals used to transmit differential signals, and the first terminal 21 and the second terminal 22 in a middle terminal group C are ground terminals. In the present embodiment of the present invention, the distance L3 between the second base portion 221 of the front terminal group C used to transmit the differential signals and the first base portion 211 of the rear terminal group C used to transmit the differential signals is greater than the distance L0 between the base portions 21' of different differential terminal groups C' in the related art (also referring to FIG. 7). That is, the configuration of the present invention, compared to the related art, increases the distance between the structures of the different terminal groups C used to transmit the differential signals occupying a larger proportion thereof (the first base portion 211 and the second base portion 221), and further reducing the interference between the different terminal groups C used to transmit the differential signals.

Figure 6:
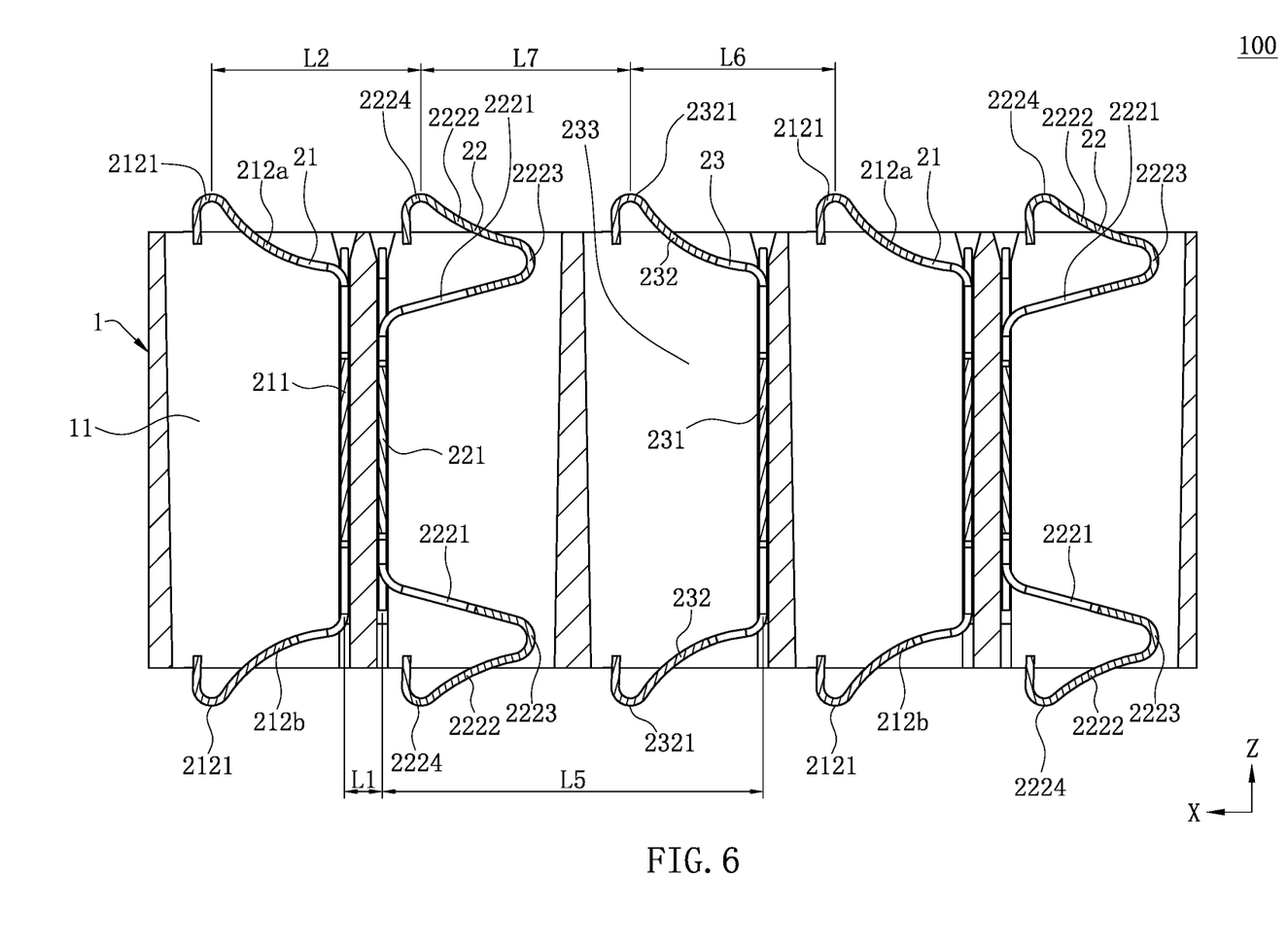
FIG. 6 is a sectional view of an electrical connector according to a second embodiment of the present invention.

FIG. 6 is a schematic view of an electrical connector 100 according to a second embodiment of the present invention. In the second embodiment, the structures and functions of the first terminal 21 and the second terminal 22 of each terminal group C are identical to those in the first embodiment, and the difference between the second embodiment and the first embodiment exists in that: the electrical connector 100 further includes at least one third terminal 23, and the conductive terminals 2 in one row is provided with at least one third terminal 23. The third terminal 23 and the terminal groups C in one row are arranged along the front-rear direction, and one third terminal 23 is arranged between two adjacent terminal groups C.

As shown in FIG. 6, a structure of the third terminal 23 is identical to a structure of one of the first terminal 21 and the second terminal 22 adjacent thereto in the front-rear direction. The third terminal 23 includes a third base portion 231 extending vertically and two third elastic arms 232 connected to an upper end and a lower end of the third base portion 231. Each third elastic arm 232 has a third contact portion 2321. In the front-rear direction, a distance L1 between the second base portion 221 and the first base portion 211 adjacent thereto at one side of the second base portion 221 is less than a distance L5 between the second base portion 221 and the third base portion 231 adjacent thereto at the other side of the second base portion 221, and a distance L6 between the third contact portion 2321 and the first contact portion 2121 adjacent thereto or a distance L7 between the third contact portion 2321 and the second contact portion 2224 adjacent thereto is equal to the distance L2 between the first contact portion 2121 and the second contact portion 2224 in each terminal group C.

As shown in FIG. 6, in the present embodiment, the third base portion 231 is in a flat plate shape. The third contact portion 2321 is located in front of the third base portion 231, and the third base portion 231 and the two third elastic arms 232 altogether form a third opening 233 facing forward. The structure of the third terminal 23 is completely identical to that of the first terminal 21. In other embodiments, the structure of the third terminal 23 may be identical to that of the second terminal 22, or may adopt other structures different from those of the first terminal 21 and the second terminal 22.

As shown in FIG. 6, in the present embodiment, the terminal groups C may be used to transmit differential signals, and the third terminal 23 functions as the ground terminal. When the first terminal 21 or the second terminal 22 of each terminal group C is used to transmit the single-ended signals, and the other terminal functions as the ground terminal, the third terminal 23 may function as the ground terminal or the signal terminal.

Figure 7:
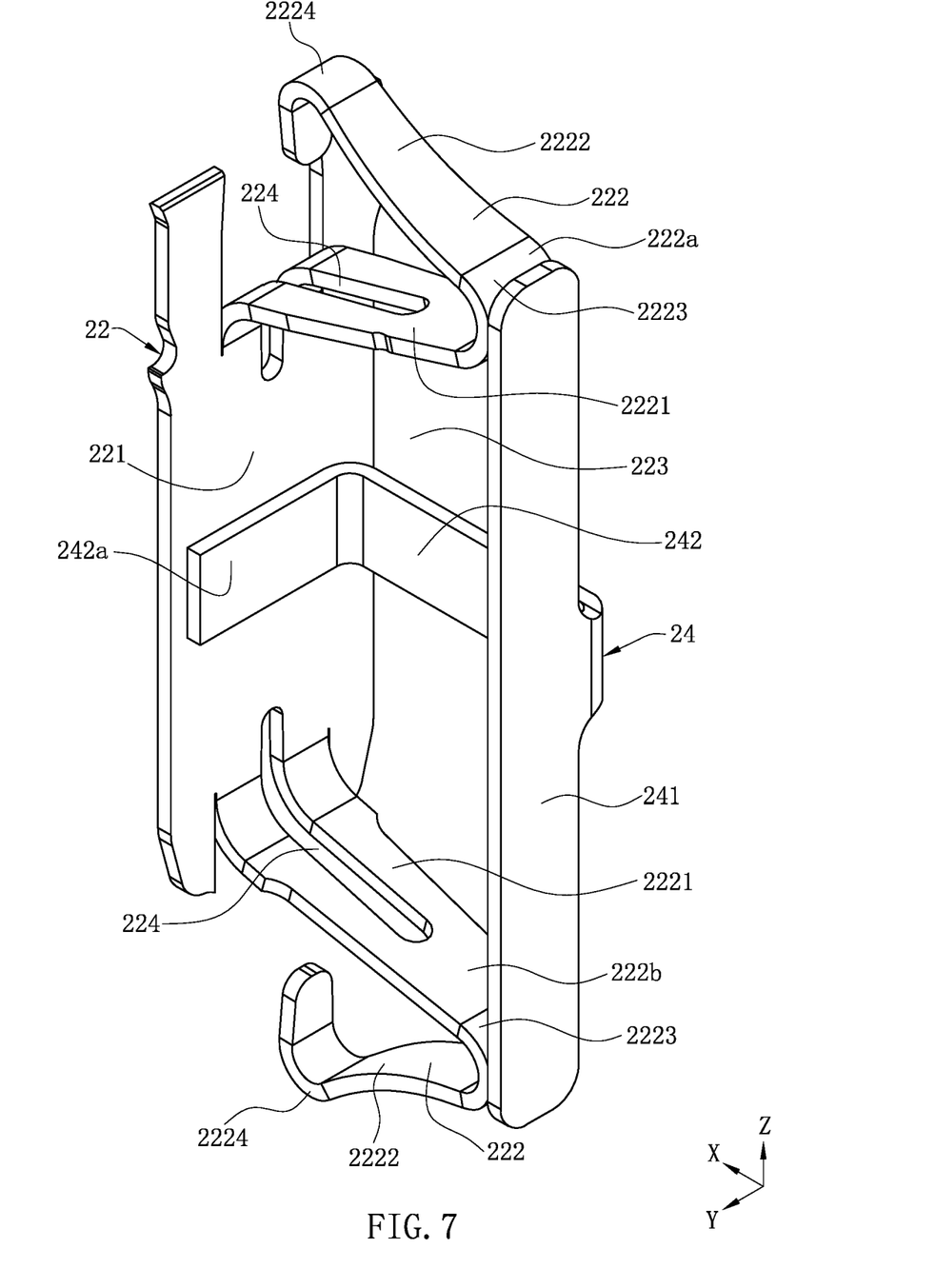
FIG. 7 is a perspective view of a second terminal and an add-on member in use according to a third embodiment of the present invention.
Figure 8:
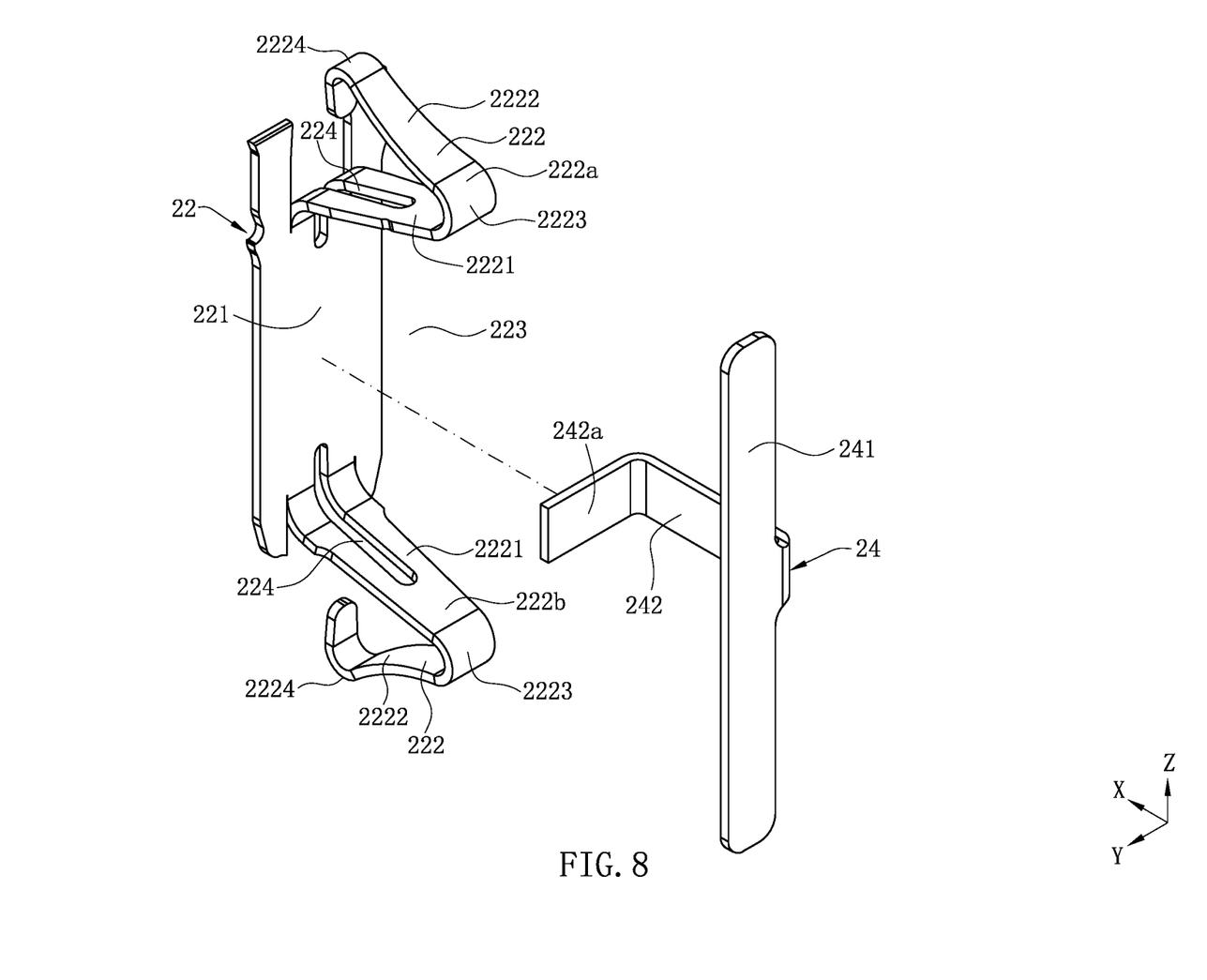
FIG. 8 is a perspective disassembled view of FIG. 7.
Figure 9:
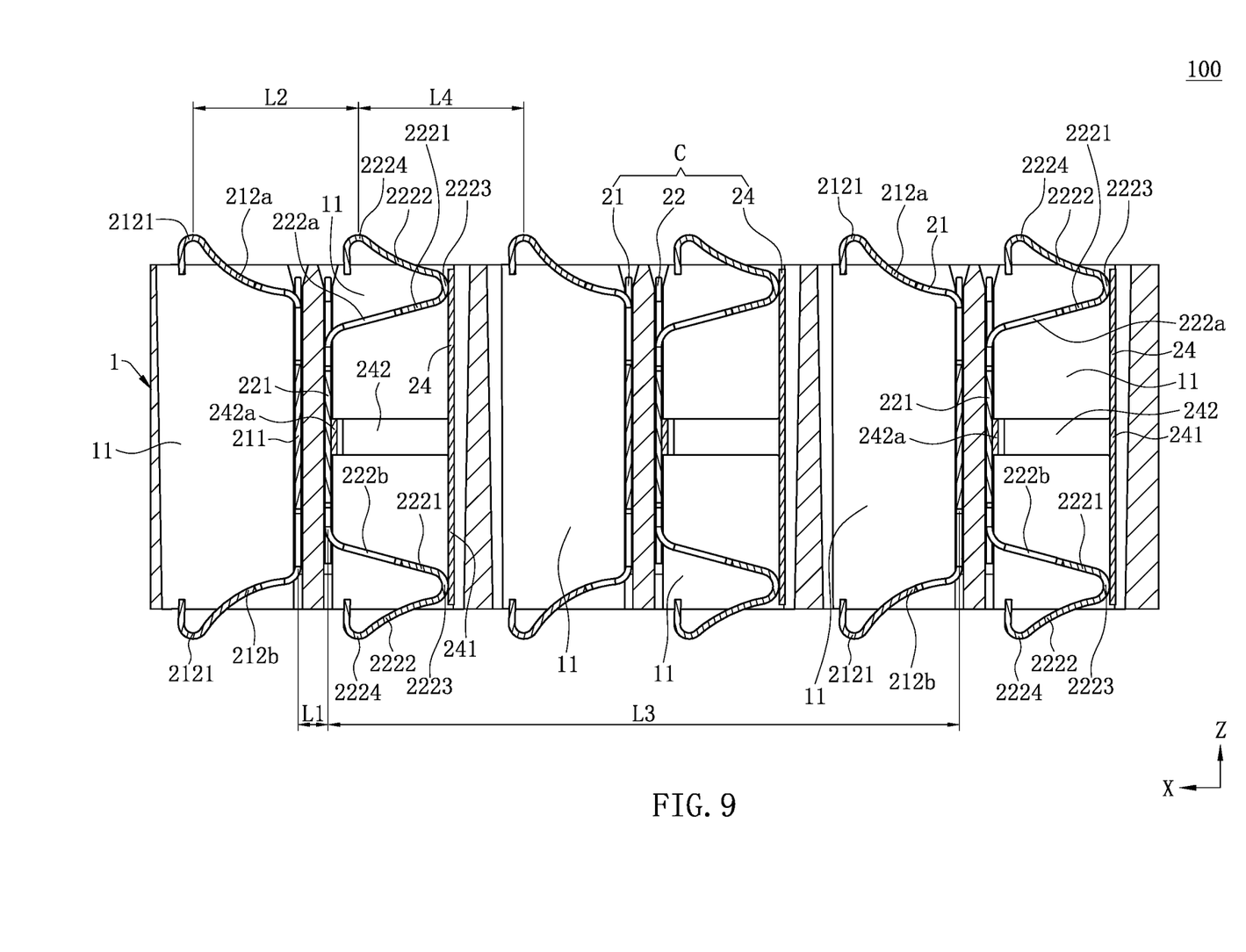
FIG. 9 is a sectional view of the third embodiment of the present invention.

FIG. 7 to FIG. 9 are schematic views of an electrical connector 100 according to a third embodiment of the present invention, which is different from the first embodiment in that: each terminal group C additionally includes an add-on member 24. The second terminal 22 and the first terminal 21 are identical to those in the first embodiment.

As shown in FIG. 7 and FIG. 8, the add-on member 24 has a fourth base portion 241 extending vertically and a connecting portion 242 extending horizontally from the fourth base portion 241. An upper end of the fourth base portion 241 extends to the bending portion 2223 of the second upper elastic arm 222a, and a lower end of the fourth base portion 241 extends to the bending portion 2223 of the second lower elastic arm 222b. In the present embodiment, regardless of whether the second elastic arms 222 are pressed by the electronic components, the fourth base portion 241 abuts the two bending portions 2223 in the front-rear direction. When the two second elastic arms 222 are pressed, the bending portions 2223 may slide vertically along the surface of the fourth base portion 241. In other embodiments, it may be configured that only after the second elastic arms 222 are pressed, the fourth base portion 241 abuts and is connected to the two bending portions 2223, and the second elastic arms 222 maintain a gap from the fourth base portion 241 prior to being pressed.

As shown in FIG. 7 and FIG. 8, the add-on member 24 and the second terminal 22 are conductively connected to each other, but the add-on member 24 and the second terminal 22 are separately formed, and are connected to each other through the connecting portion 242. The connecting portion 242 extends from a middle portion of the fourth base portion 241, and is integrally connected to a middle portion of the second base portion 221. In the present embodiment, the connecting portion 242 is connected to a side edge of the fourth base portion 241, and is provided with a bonding portion 242a which is in a flat plate shape. The bonding portion 242a and the second base portion 221, which is also in the flat plate shape, are attached to each other, and are fixed to each other through a laser soldering process.

In other embodiments, the bonding portion 242a and the second base portion 221 may be fixed to each other through spraying a conductive adhesive, or the connecting portion 242 and the second base portion 221 may be provided to fix with each other by clamping. Alternatively, the add-on member 24 and the second terminal 22 may be designed to be formed by integrally punching a metal plate. Alternatively, the second base portion 221 and the bonding portion 242a merely abut each other.

As shown in FIG. 9, the add-on member 22 and the second terminal 22 are assembled altogether in the body 1, and are configured in the same accommodating hole 11. In the same terminal group C, the fourth base portion 241 and the second base portion 221 are provided face-to-face in the front-rear direction, and the fourth base portion 241 and the first base portion 211 are located at two opposite sides of the second base portion 221. A distance between the fourth base portion 241 and the second base portion 221 in the front-rear direction is greater than the distance between the first base portion 211 and the second base portion 221 in the front-rear direction.

As shown in FIG. 9, the second terminal 22 being configured with the add-on member 24 forms a plurality of conductive paths, where the current starts from the second elastic arms 222, which flows only through the second base portion 2221, or flows only through the fourth base portion 241, or flows through the second base portion 221 and through the fourth base portion 241 through the connecting portion 242. When the second terminal 22 being configured with the add-on member 24 functions as a signal terminal, compared to the second terminal 22 in the first embodiment, it reduces the impedance, and is suited to application scenarios with lower characteristics impedances.

As shown in FIG. 9, when the second terminal 22 being configured with the add-on member 24 functions as the ground terminal, on one hand, the second base portion 221 is closer to the first base portion 211 located in front thereof, which provides better shielding effect to the first terminal 21 located in front thereof compared to the related art. On the other hand, the fourth base portion 241 remedies the distance between the second base portion 221 and the first base portion 211 located therebehind, thus providing the shielding effect to a certain degree to the first terminal 21 located therebehind for transmitting the signals compared to the first embodiment.

In other embodiments, the add-on member 24 may be conductively connected to the first terminal 21 of the terminal group C, which may be soldered together, or may be fixed together by clamping, or may abut together to form an electrical connection therebetween. The add-on member 24 may also be assembled with the first terminal 21 of the terminal group C together in the body 1, and arranged in the same accommodating hole 11. Alternatively, they may be assembled in two processes, and the two components are assembled in the body 1 in the front-rear direction.

In other embodiments, the first base portion, the second base portion, the third base portion and the fourth base portion may be provided to be substantially extending vertically instead of being strictly extending vertically straight. Using the first base portion as an example, it can be provided to extend vertically as a whole, but one section thereof is a bending structure or an oblique structure, etc. Alternatively, the first base portion may be, as a whole, slightly oblique relative to the vertical direction.

In sum, the electrical connector according to certain embodiments of the present invention has the following beneficial effects:

(1) In order to adjust the distance between the respective portions of the first terminal 21 and the second terminal 22 occupying a larger proportion thereof, on the premise of maintaining a consistent final extending direction of the first elastic arm 212 and the second elastic arm 222 in the same terminal group C without increasing the distance between the first contact portion 2121 and the second contact portion 2224 adjacent to each other, the second base portion 221 is closer to the first base portion 211, such that the second elastic arm 222 extend backward and then forward. When one of the first terminal 21 and the second terminal 22 of each terminal group C functions as a single-ended signal terminal, and the other thereof functions as the ground terminal, since the first base portion 211 and the second base portion 221 are located closer relative to the first contact portion 2121 and the second contact portion 2224, and the first base portion 211 and the second base portion 221 generally occupy a larger proportion in the whole conductive terminal 2, it is easier for the ground terminal to absorb the electromagnetic radiation emitted by the signal terminal, thus reducing the crosstalk, and enhancing the shielding effect between the signal terminals inside the electrical connector 100. When the terminal group C is used to transmit differential signals, that is, it functions as a differential signal pair, the distance between the structures of the adjacent differential signal pairs having a larger proportions thereof is increased, thus reducing the mutual capacitance and mutual inductance between the differential signal pairs, and further reducing the crosstalk between the adjacent differential signal pairs.

(2) The second contact portion 2224 does not pass forward beyond the second base portion 221, such that the overall size of the second terminal 22 in the front-rear direction is not very large, and the size of the accommodating hole 11 in the front-rear direction may be further designed not to be excessively large, thus providing more accommodating holes 11 in the insulating body 1 with limited space, and accommodating more conductive terminals 2.

(3) The location of the second upper elastic arm 222a connected to the second base portion 221 is lower than the location of the first upper elastic arm 212a connected to the first base portion 211, and the location of the second lower elastic arm 222b connected to the second base portion 221 is higher than the location of the first lower elastic arm 212b connected to the first base portion 211, thus increasing an included angle between the second base portion 221 and the first extending arm 2221, and preventing the stress at the bending location of the two components from being excessively large. Further, the bending portion 2223 and the location of each first elastic arm 212 connected to the first base portion 211 are provided to be of equal height, such that the second contact portion 2224 and the first contact portion 2121 are provided to be of equal height, thereby ensuring the first terminal 21 and the second terminal 22 with different structures may be in coplanar contact with the mated electronic component, and preventing some of the conductive terminals 2 from being in ill contact due to having different heights.

(4) The structure of the third terminal 23 is identical to the structure of one of the first terminal 21 and the second terminal 22 adjacent thereto in the front-rear direction, thus preventing from providing a mold for forming the third terminal 23, and saving the cost.

(5) By providing the first through slot 214 at the location of the first base portion 211 connected to each first elastic arm 212, the first elastic arms 212 may easily bend relative to the first base portion 211. Meanwhile, the self-capacitance of the first terminal 21 is increased, and the impedance of the first terminal 21 is reduced, such that it complies with a standard impedance range. By providing the second through slot 224 at the location of the second base portion 221 connected to each second elastic arm 222, the second elastic arms 222 may easily bend relative to the second base portion 221. Meanwhile, the self-capacitance of the second terminal 22 is increased, and the impedance of the second terminal 22 is reduced, such that it complies with a standard impedance range.

(6) The second terminal 22 being configured with the add-on member 24 forms a plurality of conductive paths, where the current starts from the second elastic arms 222, which flows only through the second base portion 2221, or flows only through the fourth base portion 241, or flows through the second base portion 221 and through the fourth base portion 241 through the connecting portion 242. When the second terminal 22 being configured with the add-on member 24 functions as a signal terminal, compared to the second terminal 22 in the first embodiment, it reduces the impedance, and is suited to application scenarios with lower characteristic impedances.

(7) When the second terminal 22 being configured with the add-on member 24 functions as the ground terminal, on one hand, the second base portion 221 is closer to the first base portion 211 located in front thereof, which provides better shielding effect to the first terminal 21 located in front thereof compared to the related art. On the other hand, the fourth base portion 241 remedies the distance between the second base portion 221 and the first base portion 211 located therebehind, thus providing the shielding effect to a certain degree to the first terminal 21 located therebehind for transmitting the signals compared to the first embodiment.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector, comprising:
a body; and
a plurality of conductive terminals accommodated in the body, wherein the conductive terminals comprise a plurality of terminal groups arranged along a front-rear direction, and each of the terminal groups is formed by a first terminal and a second terminal adjacent to each other in the front-rear direction;
wherein the first terminal comprises a first base portion and two first elastic arms connected to an upper end and a lower end of the first base portion, the first base portion and the two first elastic arms altogether form a first opening facing forward, each of the two first elastic arms has a first contact portion, and the first contact portion is located in front of the first base portion;
wherein the second terminal comprises a second base portion and two second elastic arms connected to an upper end and a lower end of the second base portion, the second elastic arms are formed by extending backward and then bending and extending forward relative to the second base portion, and each of the two second elastic arms has a second contact portion; and
wherein in a same terminal group of the terminal groups, the first base portion and the second base portion are provided face-to-face in the front-rear direction, and in the front-rear direction, a distance between the first base portion and the second base portion is less than a distance between the first contact portion and the second contact portion.

2. The electrical connector according to claim 1, wherein in the front-rear direction, the distance between the first contact portion and the second contact portion in the same terminal group is equal to a distance between the first contact portion and the second contact portion in two adjacent ones of the terminal groups.

3. The electrical connector according to claim 1, wherein the first base portion and the second base portion respectively extend vertically, and the second contact portion is located behind the second base portion.

4. The electrical connector according to claim 1, wherein the first elastic arm connected to the upper end of the first base portion is defined as a first upper elastic arm, the first elastic arm connected to the lower end of the first base portion is defined as a first lower elastic arm, the second elastic arm connected to the upper end of the second base portion is defined as a second upper elastic arm, the second elastic arm connected to the lower end of the second base portion is defined as a second lower elastic arm, a location of the second upper elastic arm connected to the second base portion is lower than a location of the first upper elastic arm connected to the first base portion, and a location of the second lower elastic arm connected to the second base portion is higher than a location of the first lower elastic arm connected to the first base portion.

5. The electrical connector according to claim 4, wherein each of the second elastic arms has a first extending arm, a second extending arm and a bending portion connecting the first extending arm and the second extending arm, the first extending arm is formed by bending and extending backward from the second base portion, the second extending arm is formed by extending forward from the bending portion, and the bending portion and a location of each of the first elastic arms connected to the first base portion are provided to be of equal height.

6. The electrical connector according to claim 1, wherein the first terminals and the second terminals of the terminal groups are arranged alternately along the front-rear direction, and in the same terminal group, one of the first terminal and the second terminal functions as a single-ended signal terminal, and the other of the first terminal and the second terminal functions as a ground terminal.

7. The electrical connector according to claim 1, wherein in three adjacent ones of the terminal groups in the front-rear direction, a front terminal group thereof and a rear terminal group thereof include signal terminals configured to transmit differential signals, and a middle terminal group thereof includes ground terminals.

8. The electrical connector according to claim 1, wherein the conductive terminals further comprise at least one third terminal, the third terminal and the terminal groups are arranged along the front-rear direction, one of the at least one third terminal is arranged between two adjacent ones of the terminal groups, each of the terminal groups is configured to transmit differential signals, and the third terminal is a ground terminal.

9. The electrical connector according to claim 8, wherein a structure of the third terminal is identical to a structure of one of the first terminal and the second terminal adjacent thereto in the front-rear direction.

10. The electrical connector according to claim 8, wherein the third terminal comprises a third base portion and two third elastic arms connected to an upper end and a lower end of the third base portion, the third base portion and the two third elastic arms altogether form a third opening facing forward, each of the two third elastic arms has a third contact portion, the third contact portion is located in front of the third base portion, and in the front-rear direction, a distance between the second base portion and the first base portion adjacent thereto at one side of the second base portion is less than a distance between the second base portion and the third base portion adjacent thereto at the other side of the second base portion.

11. The electrical connector according to claim 8, wherein the third terminal comprises a third base portion and two third elastic arms connected to an upper end and a lower end of the third base portion, each of the two third elastic arms has a third contact portion, and in the front-rear direction, a distance between the third contact portion and the first contact portion or the second contact portion adjacent thereto is equal to the distance between the first contact portion and the second contact portion in each of the terminal groups.

12. The electrical connector according to claim 1, wherein each of the terminal groups comprises an add-on member conductively connected to the second terminal, the add-on member has a fourth base portion, the fourth base portion and the second base portion are provided face-to-face in the front-rear direction, and the fourth base portion and the first base portion are located at two opposite sides of the second base portion.

13. The electrical connector according to claim 12, wherein the fourth base portion extends upward and downward to the two second elastic arms, and when the two second elastic arms are pressed, the fourth base portion abuts the two second elastic arms to form electrical connections therebetween.

14. The electrical connector according to claim 13, wherein each of the second elastic arms has a first extending arm, a second extending arm and a bending portion connecting the first extending arm and the second extending arm, the first extending arm is formed by bending and extending backward from the second base portion, the second extending arm is formed by extending forward from the bending portion, and when the two second elastic arms are pressed, the fourth base portion abuts the two bending portions of the two second elastic arms.

15. The electrical connector according to claim 12, wherein the add-on member has a connecting portion, the connecting portion is integrally connected to the fourth base portion, and the connecting portion is fixedly connected to or abuts the second base portion.

16. The electrical connector according to claim 12, wherein in the same terminal group, a distance between the fourth base portion and the second base portion in the front-rear direction is greater than the distance between the first base portion and the second base portion in the front-rear direction.

17. An electrical connector, comprising:
a body; and
a plurality of conductive terminals accommodated in the body, wherein the conductive terminals comprise a plurality of terminal groups arranged along a front-rear direction, and each of the terminal groups is formed by a first terminal and a second terminal adjacent to each other in the front-rear direction;
wherein the first terminal comprises a first base portion and a first elastic arm connected to an upper end of the first base portion, the first base portion is in a flat plate shape, the first elastic arm is formed by bending forward from the first base portion or by bending backward and then forward from the first base portion, the first elastic arm has a first contact portion, and the first contact portion is located in front of the first base portion;
wherein the second terminal comprises a second base portion and a second elastic arm connected to an upper end of the second base portion, the second base portion is in a flat plate shape, the second elastic arm is formed by extending backward and then bending and extending forward relative to the second base portion, and the second elastic arm has a second contact portion; and
wherein in a same terminal group of the terminal groups, the first base portion and the second base portion are provided face-to-face in the front-rear direction, and in the front-rear direction, a distance between the first base portion and the second base portion is less than a distance between the first contact portion and the second contact portion.

18. The electrical connector according to claim 17, wherein the first terminal and the second terminal in each of the terminal groups are both ground terminals or are both signal terminals, the terminal groups being arranged in the front-rear direction are arranged in a ground-signal alternate manner, and the terminal groups including both the signal terminals are configured to transmit differential signals.

19. The electrical connector according to claim 17, wherein each of the terminal groups comprises an add-on member, the add-on member has a fourth base portion extending vertically, and the fourth base portion and one of the first base portion and the second base portion are provided face-to-face in the front-rear direction.

20. The electrical connector according to claim 19, wherein the fourth base portion and the first base portion are located at two opposite sides of the second base portion, the add-on member has a connecting portion, the connecting portion is integrally connected to the fourth base portion, the connecting portion and the second base portion are fixed by soldering, and the add-on member and the second terminal are altogether assembled to the body.

* * * * *